(12) United States Patent
Chen et al.

(10) Patent No.: US 7,247,909 B2
(45) Date of Patent: Jul. 24, 2007

(54) METHOD FOR FORMING AN INTEGRATED CIRCUIT WITH HIGH VOLTAGE AND LOW VOLTAGE DEVICES

(75) Inventors: Fu-Hsin Chen, Jhudong Township, Hsinchu County (TW); Wen-Hua Huang, Hsinchu (TW); Kuo-Ting Lee, Yongho (TW); You-Kuo Wu, Sizhih (TW); An-Min Chiang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/271,933

(22) Filed: Nov. 10, 2005

(65) Prior Publication Data

US 2007/0102759 A1   May 10, 2007

(51) Int. Cl.
*H01L 29/76* (2006.01)
*H01L 21/8234* (2006.01)

(52) U.S. Cl. ............... 257/336; 257/392; 257/E29.266; 438/275; 438/305

(58) Field of Classification Search ................ 438/197, 438/199, 275, 305; 257/288, 368, 392, E21.409, 257/E29.266, 335, 336
See application file for complete search history.

(56) References Cited

U.S. PATENT DOCUMENTS

| 5,696,400 | A  | * | 12/1997 | Yoshida et al. | ............. | 257/392 |
| 6,759,299 | B2 | * | 7/2004  | Lee et al.     | ................... | 438/258 |
| 6,849,489 | B2 | * | 2/2005  | Rabkin et al.  | .............. | 438/199 |

* cited by examiner

*Primary Examiner*—T. N. Quach
(74) *Attorney, Agent, or Firm*—Kirkpatrick & Lockhart Preston Gates Ellis

(57) ABSTRACT

A method is disclosed for integrally forming at least one low voltage device and at least one high voltage device. According to the method, a first gate structure and a second gate structure are formed on a semiconductor substrate, wherein the first and second gate structures are isolated from one another. One or more first double diffused regions are formed adjacent to the first gate structure in the semiconductor substrate. One or more second double diffused regions are formed adjacent to the second gate structure in the semiconductor substrate. One or more first source/drain regions are formed within the first double diffused regions. One or more second source/drain regions are formed within the second double diffused regions. The first double diffused regions function as one or more lightly doped source/drain regions for the low voltage device.

9 Claims, 2 Drawing Sheets

METHOD FOR FORMING AN INTEGRATED CIRCUIT WITH HIGH VOLTAGE AND LOW VOLTAGE DEVICES

BACKGROUND

The present invention relates generally to semiconductor processing technology, and more particularly to a method for forming an integrated circuit (IC) having both high voltage and low voltage devices.

Many of today's IC's have some devices operating at a low voltage and other devices operating at a high voltage. For example, a liquid crystal display (LCD) driver is one of those IC's that have both low and high voltage devices. In order to operate in a high voltage condition, the metal-oxide-semiconductor (MOS) transistors of the LCD driver need to sustain high voltages without experiencing breakdown or parametric shifts. Although the breakdown voltage of the MOS transistor can be increased by using a thick gate oxide, hot carrier injection between its source and drain remains a concern. A variety of specialized transistor structures have been developed to minimize this hot carrier effect.

A double diffused drain (DDD) MOS transistor is one of the structures typically used for high voltage operations. The source/drain region of the DDDMOS transistor is constructed by two overlapping regions doped with impurities of different densities. Such DDDMOS transistor can provide a high breakdown voltage to better sustain an electrostatic discharge. The DDD structure can also provide a solution to the hot carrier effect when the transistor operates in a high voltage condition.

Conventionally, the processes of constructing the DDDMOS transistor operating at high voltages are incorporated in the typical processes of forming low voltage MOS transistors. This approach requires extra masks and ion implantation steps, thereby increasing the costs of manufacturing an IC with both the DDDMOS and low voltage MOS transistors.

It is therefore desirable to have methods for integrally constructing high and low voltage devices without the penalty of additional masks and processes that drive up the manufacturing costs.

SUMMARY

The present invention discloses a method for integrally forming at least one first device operating at a first voltage and at least one second device operating at a second voltage higher than the first voltage. In one embodiment of the present invention, a first gate structure and a second gate structure are formed on a semiconductor substrate, wherein the first and second gate structures are isolated from one another. One or more first double diffused regions are formed adjacent to the first gate structure in the semiconductor substrate. One or more second double diffused regions are formed adjacent to the second gate structure in the semiconductor substrate. One or more first source/drain regions are formed within the first double diffused regions. One or more second source/drain regions are formed within the second double diffused regions. The first double diffused regions function as one or more lightly doped source/drain regions for the first device.

The construction and method of operation of the invention, however, together with additional objects and advantages thereof will be best understood from the following description of specific embodiments when read in connection with the accompanying drawings.

BRIEF DESCRIPTION OF THE DRAWINGS

DESCRIPTION fig 1 illustrates a cross-sectional view 100 of a conventional IC having a low voltage device 102 and a high voltage device 104. It is noted that the devices 102 and 104 are constructed on the same semiconductor substrate. Conventionally, the processes of constructing the high voltage device 104 are incorporated in the processes that are used for forming the low voltage device 102.

Figure 1:
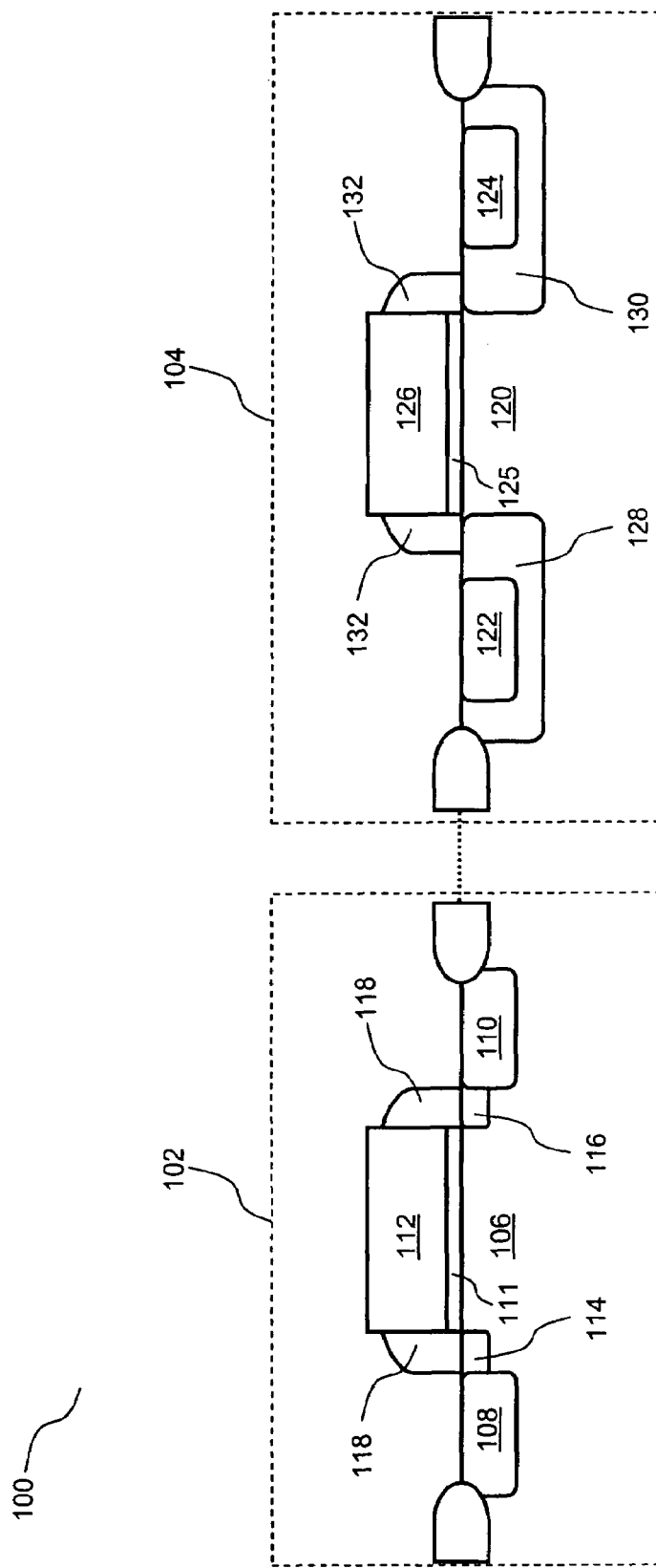
FIG. 1 illustrates a conventional IC having both low voltage and high voltage devices.

The low voltage device 102 includes a well 106, drain 108, source 110, gate oxide 111, and poly-silicon gate (poly-gate) 112. Spacers 118 are formed on the sidewalls of the poly-gate 112 and the gate oxide 111. A lightly doped drain (LDD) region 114 extending from the drain 108 is formed under the spacer 118. An LDD region 116 extending from the source 110 is formed under the spacer 118. The high voltage device 104 includes a well 120, drain 122, source 124, gate oxide 125, poly-gate 126, and DDD regions 128 and 130. Spacers 132 are formed on the sidewalls of the poly-gate 126 and the gate oxide 125. Unlike the LDD regions 114 and 116, the DDD region 128 completely surrounds the drain 122, while the DDD region 130 completely surrounds the source 124. The DDD regions 128 and 130 provide a high breakdown voltage for the high voltage device 104.

Conventionally, the LDD regions 114 and 116, and the DDD regions 128 and 130 are formed by separate processing steps. The gate oxides 111 and 125 and poly-gates 112 and 126 are formed by the same series of processing steps. A first mask then covers the low voltage device 102 and exposes the high voltage device 104. An ion implantation process is performed, using the first mask as a shield for the low voltage device 102, to form the DDD regions 128 and 130. The first mask is then removed and replaced by a second mask covering the high voltage device 104 and exposing the low voltage device 102. An ion implantation process is performed, using the second mask as a shield for the high voltage device 104, to form the LDD regions 114 and 116. The source 110 and drain 108 are formed adjacent to the LDD regions 116 and 114, and the source 124 and drain 122 are formed within the DDD regions 130 and 128 in subsequent processing steps. It is noted that a semiconductor wafer always contains both P-type and N-type transistors for both the low and high voltage devices. During the fabrication of the wafer, two sets of masks and ion implantation processing steps are required to form LDD regions for both the P-type and N-type low voltage devices. Likewise, two sets of masks and ion implantation processing steps are required to form DDD regions for both the P-type and N-type high voltage devices.

This conventional processing method requires additional masks and ion implantation steps for forming the DDD regions, therefore driving up the fabrication costs. Also note that the threshold voltage (Vt) of the high voltage and low voltage devices 104 and 102 fabricated by the conventional method would be different due to the separately formed LDD regions 114, 116 and the DDD regions 128, 130.

Figure 2A:
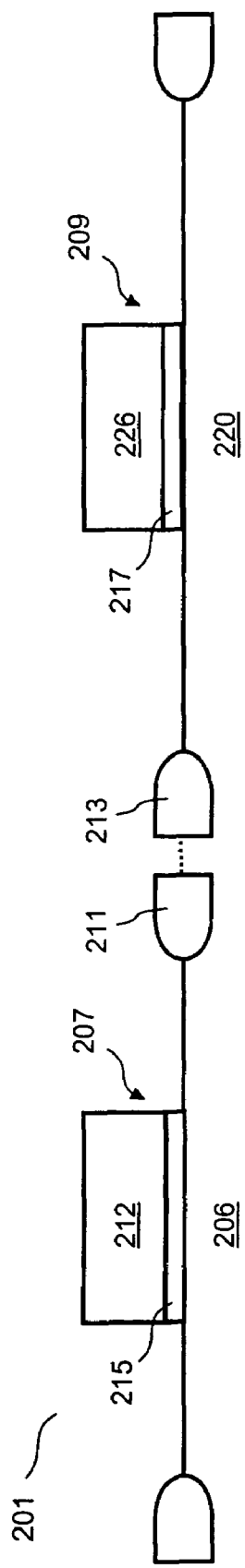
FIGS. 2A through 2C illustrate a process flow of forming an IC having both low and high voltage devices in accordance with one embodiment of the present invention.
Figure 2B:
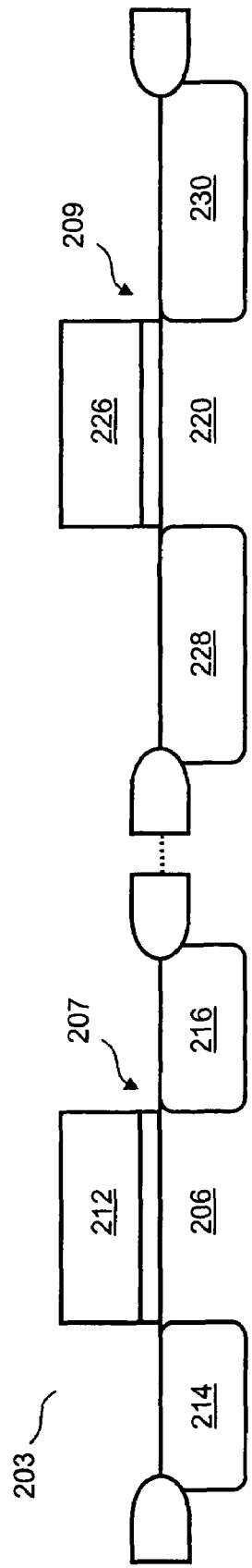
Figure 2C:
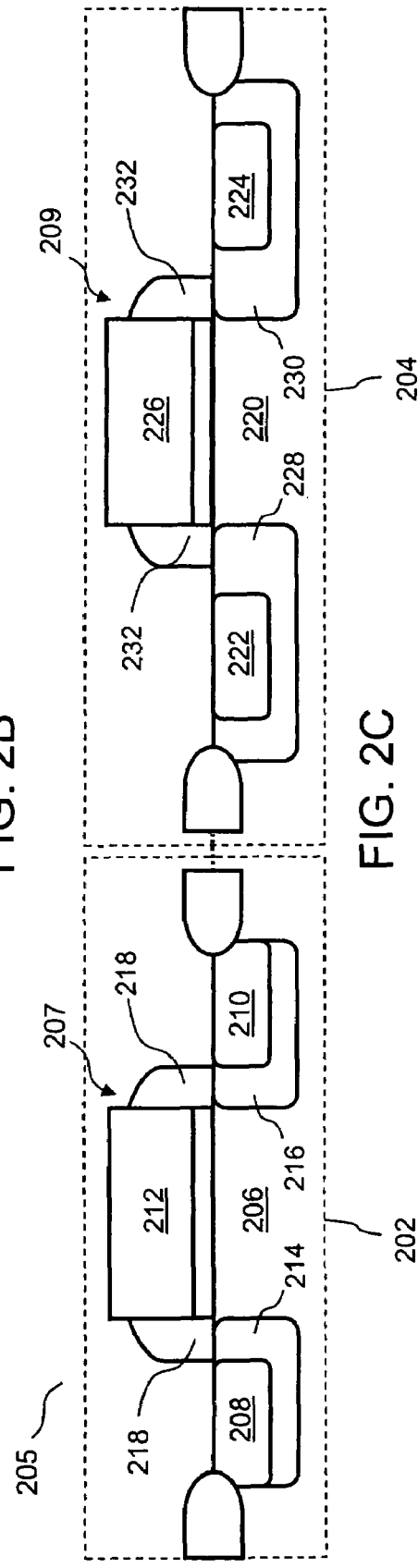

FIGS. 2A through 2C illustrate a process flow of forming an IC having both low and high voltage devices in accordance with one embodiment of the present invention. The cross-sectional view 201 shows a semiconductor structure having a first gate structure 207 and a second gate structure 209 constructed on first and second wells 206 and 220 of a semiconductor substrate, respectively. The first gate structure 207 includes a first gate dielectric 215 and a first gate electrode 212. The first gate dielectric 215 may include oxide, nitride, oxynitride, high-k dielectrics, or combinations thereof. The first gate electrode 212 may comprise polysilicon, metal, or combinations thereof. The second gate structure 209 includes a second gate dielectric 217 and a second gate electrode 226. The first gate dielectric 217 may include oxide, nitride, oxynitride, high-k dielectrics, or combinations thereof. The second gate electrode 226 may comprise polysilicon, metal, or combinations thereof. The first and second gate structures 207 and 209 are isolated from one another by isolation structures 211 and 213. The first isolation structure 211 defines a first active area in which a low voltage device will be constructed in the following steps. The second isolation structure 213 defines a second active area in which a high voltage device will be constructed in the following steps. It is understood that the isolation structures 211 and 213 can be local oxidation of silicon (LOCOS) or shallow trench isolation (STI).

An ion implantation step is performed to yield a semiconductor structure as shown in a cross-sectional view 203. During the ion implantation, DDD regions 214 and 216 are formed adjacent to the first gate structure 207 in the first well 206, and DDD regions 228 and 230 are formed adjacent to the second gate structure 209 in the second well 220, simultaneously. The first and second gate structures 207 and 209 shield the first and second wells 206 and 220 thereunder from being exposed to implanting ions. Thus, the inner boundary lines of the DDD regions 214 and 216 would be substantially aligning with sidewalls of the first gate structure 207, and the inner boundary lines of the DDD regions 228 and 230 would be substantially aligning with sidewalls of the second gate structure 209.

Spacers 218 and 232, and source/drain regions 208, 210, 222, and 224 are subsequently formed to yield a semiconductor structure as shown in a cross-sectional view 205. A first set of spacers 218 are formed on the sidewalls of the first gate structure 207. A second set of spacers 232 are formed on the sidewalls of the second gate structure 209. Following the formation of the spacers 218 and 232, the drain 208 and the source 210 are implanted within their corresponding DDD regions 214 and 216, and the drain 222 and the source 224 are also implanted within their corresponding DDD regions 228 or 230. The gate structure 207, drain 208, source 210, and DDD regions 214 and 216 collectively provide a device 202 that operates at a low voltage level. The gate structure 209, drain 222, source 234 and DDD regions 228 and 230 collectively provide a device 204 that operates at a high voltage level.

In this embodiment, the DDD regions 214 and 216 entirely surround the drain 208 and source 210, respectively, while the DDD regions 228 and 230 entirely surround the drain 222 and source 224, respectively. For example, in a 0.5 µm technology, the junction depth of the source/drain 208, 222, 210 and 224 can be designed to range from 0.2 to 0.3 µm, while the junction depth of the DDD regions 214, 216, 228, and 230 can be designed to range from 0.5 to 0.7 µm. The DDD regions 228 and 230 are wider than the DDD regions 214 and 216, for reducing the hot carrier injection between the drain 222 and source 224 of the high voltage device 204. The dopant densities of the drain 208 and source 210 are higher than those of the DDD regions 214 and 216.

The dopant densities of the drain 222 and source 224 are higher than those of the DDD regions 228 and 230. The inner boundary lines of the drain 208 and source 210 are substantially aligning with outer surfaces of the first spacers 218, while the inner boundary lines of the drain 222 and source 224 are distant from outer surfaces of the second spacers 232.

One advantage of the present invention is to simplify the process of fabricating an IC that has both low and high voltage devices. The DDD regions 214 and 216 of the low voltage device 202 function as LDD regions of conventional MOS transistors for reducing the hot carrier effect. Because the DDD regions 214 and 216 of the low voltage device 202 and the DDD regions 228 and 230 of the high voltage device 204 are formed in an integral process step, the masks and ion implantation processing steps that were conventionally employed for forming the LDD regions are therefore eliminated. During the fabrication of an IC, a semiconductor wafer usually includes devices of both N-type and P-type. Conventionally, at least two sets of masks and ion implantation steps are required to form the LDD regions for the N-type and P-type devices separately. Thus, the present invention can save at least two masks and two ion implantation steps during the fabrication of the IC. This will reduce the manufacturing costs significantly.

It is noted that the threshold voltage for the low voltage device 202 and the high voltage device 204 will be the same since they both use the similar DDD regions except that the high voltage device 204 has a large diffused region for limiting the hot carrier effect. This helps to avoid the deviation of threshold voltages for the low and high voltage devices.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A method for integrally forming at least one first device operating at a first voltage and at least one second device operating at a second voltage higher than the first voltage, the method comprising:

forming a first gate structure and a second gate structure on a semiconductor substrate, the first and second gate structures being isolated from one another;

forming one or more first spacers on sidewalls of the first gate structure and one or more second spacers on sidewalls of the second gate structure;

forming one or more first double diffused regions adjacent to the first gate structure in the semiconductor substrate, and one or more second double diffused regions adjacent to the second gate structure in the semiconductor substrate; and forming one or more first source/drain regions within the first double diffused regions and one or more second source/drain regions within the second double diffused regions, wherein a junction depth of the first and second double diffused regions is deeper by 0.2 to 0.5 μm than a junction depth of the first and second source/drain regions, wherein the first double diffused regions function as one or more lightly doped source/drain regions for the first device, and the second double diffused regions function as one or more lightly doped source/drain regions for the second device, and wherein the first source/drain region has an inner boundary line substantially aligning with an outer surface of the first spacer and the second source/drain region has an inner boundary line distant from an outer surface of the second spacer such that the hot carrier effect caused by the second voltage higher than the first voltage is reduced.

2. The method of claim 1 wherein the step of forming the first and second double diffused regions comprises implanting ions into the semiconductor substrate uncovered by the first and second gate structures, simultaneously.

3. The method of claim 1 wherein the first and second source/drain regions have dopant densities higher than those of the first and second double diffused regions.

4. The method of claim 1 wherein the first and second double diffused regions have inner boundary lines substantially aligning with the sidewalls of the first and second gate structures, respectively.

5. An integrated circuit having at least one first device operating at a first voltage and at least one second device operating at a second voltage higher than the first voltage, the integrated circuit comprising:

a first gate structure and a second gate structure on a semiconductor substrate, the first and second gate structures being isolated from one another by at least one isolation structure;

one or more first and second spacers on sidewalls of the first and second gate structures, respectively;

one or more first double diffused regions adjacent to the first gate structure in the semiconductor substrate;

one or more second double diffused regions adjacent to the second gate structure in the semiconductor substrate;

one or more first source/drain regions formed within the first double diffused regions; and one or more second source/drain regions formed within the second double diffused regions, wherein a junction depth of the first and second double diffused regions is deeper by 0.2 to 0.5 μm than a junction depth of the first and second source/drain regions, wherein the first double diffused regions function as one or more lightly doped source/drain regions for the first device, and the second double diffused regions function as one or more lightly doped source/drain regions for the second device, and wherein the first source/drain region has an inner boundary line substantially aligning with an outer surface of the first spacer and the second source/drain region has an inner boundary line distant from an outer surface of the second spacer such that the hot carrier effect caused by the second voltage higher than the first voltage is reduced.

6. The integrated circuit of claim 5 wherein the first and second source/drain regions have dopant densities higher than those of the first and second double diffused regions.

7. The integrated circuit of claim 5 wherein the first and second double diffused regions have inner boundary lines substantially aligning with the sidewalls of the first and second gate structures, respectively.

8. A method for integrally forming at least one first device operating at a first voltage and at least one second device operating at a second voltage higher than the first voltage, the method comprising:

defining a first active area and a second active area on a semiconductor substrate;

forming a first gate structure having a first gate dielectric layer and a first gate electrode on the semiconductor substrate in the first active area, and a second gate structure having a second gate dielectric layer and a second gate electrode on the semiconductor substrate in the second active area;

forming one or more first double diffused regions adjacent to the first gate structure in the semiconductor substrate of the first active area, and one or more second double diffused regions adjacent to the second gate structure in the semiconductor substrate of the second active area;

forming one or more first spacers on sidewalls of the first gate structure, and one or more second spacers on sidewalls of the second gate structure; and forming one or more first source/drain regions within the first double diffused regions and one or more second source/drain regions within the second double diffused regions, wherein a junction depth of the first and second double diffused regions is deeper by 0.2 to 0.5 μm than a junction depth of the first and second source/drain regions, wherein the first double diffused regions function as one or more lightly doped source/drain regions for the first device, and the second double diffused regions function as one or more lightly doped source/drain regions for the second device, and wherein the first source/drain region has an inner boundary line substantially aligning with an outer surface of the first spacer and the second source/drain region has an inner boundary line distant from an outer surface of the second spacer such that the hot carrier effect caused by the second voltage higher than the first voltage is reduced.

9. The method of claim 8 wherein the step of forming the first and second double diffused regions comprises implanting ions into the semiconductor substrate uncovered by the first and second gate structures, simultaneously.

* * * * *